US008085956B2

(12) United States Patent
Jennings

(10) Patent No.: US 8,085,956 B2
(45) Date of Patent: Dec. 27, 2011

(54) FILTER CIRCUIT FOR AN ELECTRET MICROPHONE

(75) Inventor: Michael Jennings, McKinney, TX (US)

(73) Assignee: Knowles Electronics, LLC, Itasca, IL (US)

( * ) Notice: Subject to any disclaimer, the term of this patent is extended or adjusted under 35 U.S.C. 154(b) by 1046 days.

(21) Appl. No.: 11/956,615

(22) Filed: Dec. 14, 2007

(65) Prior Publication Data

US 2009/0154729 A1   Jun. 18, 2009

(51) Int. Cl.
*H04R 25/00*   (2006.01)
*H01L 27/06*   (2006.01)

(52) U.S. Cl. ........................................ 381/174; 257/533

(58) Field of Classification Search .................. 381/111, 381/113, 174, 175; 257/419, 533, E31.123
See application file for complete search history.

(56) References Cited

U.S. PATENT DOCUMENTS

| 4,764,690 | A | * | 8/1988 | Murphy et al. | 307/400 |
| 5,208,551 | A | * | 5/1993 | Jung et al. | 330/149 |
| 5,337,011 | A | | 8/1994 | French et al. | |
| 5,446,413 | A | * | 8/1995 | Loeppert et al. | 330/277 |
| 5,760,642 | A | | 6/1998 | Yada et al. | |
| 6,144,257 | A | | 11/2000 | Bouras et al. | |
| 6,532,293 | B1 | * | 3/2003 | Collins | 381/191 |

FOREIGN PATENT DOCUMENTS

WO   WO-01/60117 A2   8/2001

OTHER PUBLICATIONS

International Search Report for Application No. PCT/US08/054466 dated Jul. 9, 2008.

* cited by examiner

*Primary Examiner* — Calvin Lee
(74) *Attorney, Agent, or Firm* — Fitch, Even, Tabin & Flannery

(57) ABSTRACT

A miniature electret microphone includes an input buffer circuit. The input buffer circuit includes an integrated circuit including a floating ground substrate and a p-n junction. The p-n junction is coupled as a capacitor to a filter circuit of the input buffer circuit.

6 Claims, 3 Drawing Sheets

FILTER CIRCUIT FOR AN ELECTRET MICROPHONE

TECHNICAL FIELD

This patent relates to the field of listening devices and in particular relates to a filter circuit that may be used with an electret microphone of a listening device.

BACKGROUND

Miniature electret microphones for use in hearing instrument (HI) devices often incorporate electronic filters in order to achieve improved performance of the HI system. A low pass filter (LPF) can be used to address the susceptibility of the HI to high amplitude, low frequency disturbances such as wind and road noise that tend to saturate the input buffer. A high pass filter (HPF) can be used to reject higher frequency disturbances such as ultrasonic interference and switching noise from the signal processing component.

Alternatively, microphones for HI devices may incorporate mechanical filters, for example, screens or other structures within the audio ports of the device that provide a filtering affect. The physical screen, usually located in the input port of a microphone of the HI device may be used to perform acoustic damping of the microphone's inherent resonance.

Use of electronic filters in place of mechanical, screen filters offer some performance advantages by reducing noise inherent with the mechanical filter. Additionally, the electronic filter also allows integration of the filter components within other electronics of the hearing instrument.

Integrating filter components on an integrated circuit of the HI instead of using discrete components on the circuit assembly is highly desirable for manufacturability, reliability, and cost. There is a tradeoff in the volume reduction of these components (predominately for the external chip capacitors) and the area needed to integrate these components. For very small footprint microphones, it is important to minimize the volume of the internal circuitry of the microphone as well as to reduce the stray capacitances loading the input. Reducing stray capacitance loading of the input is also necessary to minimize the sensitivity loss of the microphone.

To reduce the sensitivity loss as a result of stray capacitance in the microphone, a floating substrate can be driven in such a way as to guard out the stray capacitance that exists from the charged back plate (input of the buffer circuit) and the substrate of the die. Such an arrangement is shown in commonly owned U.S. Pat. No. 5,466,413, the disclosure of which is hereby expressly incorporated herein by reference. Normally, the substrate of the die is grounded, and the stray capacitance presents a capacitive load on the input to ground reducing circuit gain and overall microphone sensitivity. This parasitic capacitance can significantly degrade the sensitivity of the microphone for very small footprint microphones because the die is very close to the backplate of the microphone and the motor capacitance driving the buffer input is small (due to the small microphone package and manufacturing tolerances). The motor capacitance is on the order of a pico farad, so stray capacitances on the order of a hundred femto farads can reduce the sensitivity by a decibel (dB).

Floating the substrate and driving it with a buffered copy of the input signal can be used to guard out stray capacitance to reduce signal loss. The drawback of this method is increased circuit noise due to the feedback of the guarded signal to the input. This further highlights the need to minimize stray capacitance even when it is being guarded out. One way of minimizing this stray capacitance is by increasing the gap between the back plate of the microphone and the circuit assembly. This is not easily accomplished in a miniature microphone. Another way is by reducing the area of the integrated circuit die.

Integrated filter capacitors can be implemented using either thin film capacitors or by utilizing the depletion region of a p-n junction. Maximizing the capacitance per unit area assists the designer in minimizing the area of the die. Junction capacitors for integrated circuits have been utilized in the prior art in grounded substrate designs. However, because there is little or no benefit of using a floating substrate architecture in normal applications or large footprint miniature electret microphones, they have not been used in such applications.

BRIEF DESCRIPTION OF THE DRAWINGS

For a more complete understanding of the disclosure, reference should be made to the following detailed description and accompanying drawings.

Figure 1:
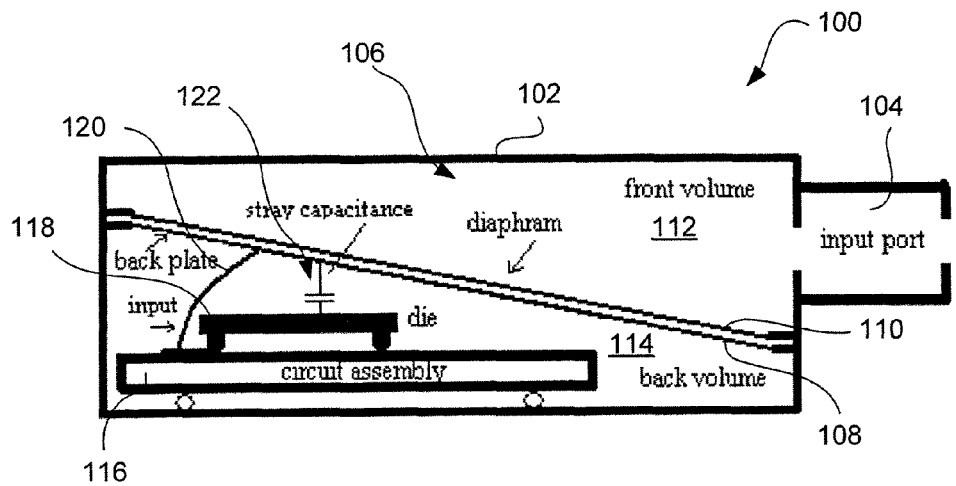
FIG. 1 is a graphic illustration of a microphone transducer adapted in accordance with the preferred embodiments of the invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

While the present invention is susceptible to various modifications and alternative forms, certain embodiments are shown by way of example in the drawings and these embodiments will be described in detail herein. It should be understood, however, that this disclosure is not intended to limit the invention to the particular forms described, but to the contrary, the invention is intended to cover all modifications, alternatives, and equivalents falling within the spirit and scope of the invention defined by the appended claims.

A miniature electret microphone that may be used in any number of devices for converting acoustic signals to electrical representations of those signals may incorporate electronic filtering as part of an associated buffer circuit. The miniature electret microphone may be incorporated into, for example, a hearing instrument, such as a hearing aid, and the filtering/buffer circuit may be incorporated within the die of an integrated circuit associated with the hearing instrument. There is, of course, no limitation on the application of the miniature electret microphone, which may find use in communication devices, computing devices or virtually any application that requires conversion of acoustic signals to electrical signals.

The buffer circuit for the miniature electret microphone may incorporate one stage or multiple stages of filtering, and for example, the buffer circuit may incorporate a low pass filter (LPF) and a high pass filter (HPF) defining a band pass. The LPF may be configured to reject high amplitude, low frequency disturbances such as wind and road noise, which tend to saturate the buffer circuit. The HPF may be configured to reject higher frequency disturbances such as ultrasonic interference and switching noise from the signal processing components. Advantageously, the HPF may replace the traditionally used physical/acoustic screen filter disposed in the inlet port of the microphone. Such use of the HPF may provide further benefit of reducing or eliminating input screen resistance noise providing an overall reduction in system noise with reduced manufacturing complexity.

FIG. 1 illustrates a miniature electret microphone 100 including a microphone housing 102 and an inlet port 104 coupling an exterior of the housing 102 to an interior 106. The interior 106 is divided by a back plate 108 and diaphragm 110 assembly into a front volume 112 and a back volume 114. In this manner, the microphone 100 is of conventional design, although it will be appreciated that the invention has application to alternative constructions. As is well known, the back plate 108 and diaphragm 110 assembly form a capacitor the value of which changes responsive to changes in the relative position of the diaphragm 110 to the back plate 108 responsive to sound pressure on the diaphragm 110.

The miniature electret microphone 100 further includes a circuit assembly 116, for example a printed circuit board or suitable structure onto which one or more electric circuit components may be disposed and operatively coupled. One such component, an integrated circuit 118 is shown operatively coupled to the circuit assembly 116. The circuit assembly 116 is suitably coupled to the back plate 108 by a wire bond 120, for example, although other structure for coupling the back plate 108 to the circuit assembly 116 may be used. Because of the charged nature of the back plate 108, stray or parasitic capacitance 122 may be established between the back plate 108 and the circuit assembly 116.

The integrated circuit 118 may incorporate, among other signal processing circuits associated with the microphone 100, a buffer circuit 200. In the embodiment illustrated by FIG. 2, the buffer circuit 200 includes a first buffer stage 202, a second buffer stage 204, a filter 206 that may include a low pass filter (LPF) 208 and a high pass filter (HPF) 210 coupled between an input 212 and an output 214. The buffer circuit 200 further couples to a power source 216 and a ground or reference 219. The first buffer stage 202 may include first and second input transistors 220 and 222, first and second input diodes 224 and 226 and resistor 250 and have an output MNOUT1. The first input transistor 220 may be a depletion mode NMOS transistor that couples to the back plate 108 of the microphone 100 through terminal VIN. The input 212 is further biased with anti-parallel diodes 224 and 226 to ground 219. The second buffer stage 204 may include first and second output transistors 230 and 232 and resistor 234 and have an output MNOUT2. The first buffer stage 202 and the second buffer stage 204 may be separated by the filter 206, which may be a band pass filter.

Figure 2:
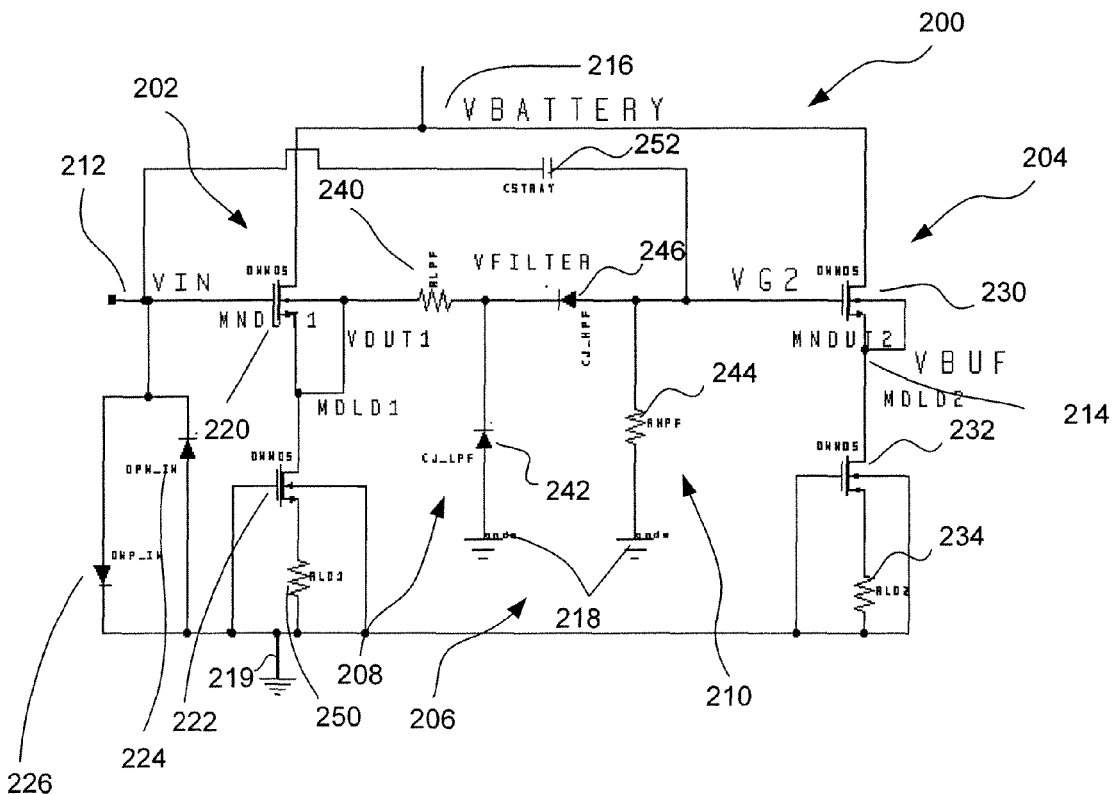
FIG. 2 is a circuit diagram illustrating incorporation of one or more filters into the microphone circuit as shown in FIG. 1.

As shown in FIG. 2, the filter 206 includes the LPF 208 and the HPF 210 forming the pass band. The LPF 208 may be located at the output of either one of the first buffer stage 202 or the second buffer stage 204. There are advantages and hence it is preferred to locate the LPF 208 at the output of the first buffer stage 202 if the capacitor is integrated. This is because the low output impedance is often desired from a microphone buffer, and the useful corner frequency of the LPF 208 dictates use of a relatively large capacitance. Setting the corner frequency of the HPF 210 may also dictate use of a relatively large capacitance, for example, on the order of several hundred Pico Farads. The input diodes 226 and 220 form a HPF with the transducer's motor capacitance connected at VIN (not shown). The diodes are dc biased at ground and have about 10 TOhms of resistance. This is the normal biasing scheme for microphone buffers.

The bias current of MNOUT 1 is set by a constant current source formed by second input transistor 222, which may be a depletion mode NMOS transistor and resistor 250. The output impedance of the first stage buffer and resistor 240 form the R of the low pass filter 208. The C is formed by junction capacitor 242.

The second buffer stage 204 is driven by the HPF junction capacitor 246 and is dc biased at ground through the HPF resistor 244. The HPF capacitor 246 is made by the junction capacitance of the substrate to n-type isolation biased at VFILTER. The substrate is connected to the input of the second buffer stage 204 and is therefore dc biased to ground and driven with a buffered version of the input signal at the output of the LPF 208. This is a preferred implementation for guarding out the stray capacitance 252 from the output of the transducer 100 connected at VIN and the substrate, because it allows for the substrate to isolation junction diode to be used as part of the HPF capacitor 246. This helps increase the die area utilization which helps minimize the stray feedback capacitor and thus electronic noise when using a floating substrate design.

Advantageously, the filter capacitance may be provided by the capacitance of the junction diodes formed using the isolation regions available in many semiconductor manufacturing processes, including, for example, most analog BiCMOS processes, may form one or more of the filter capacitors. These junction diodes exist between the substrate and various isolation regions. This junction capacitor could be stacked with linear capacitors or other circuitry in order to maximize the capacitance per unit area. Significant die footprint reduction can be achieved using these junction capacitors in a floating substrate design to form the electronic filters, e.g., LFP 208 and HPF 210, in the impedance buffer circuit 200 for the miniature electret microphone 100.

The use of junction capacitors in a floating substrate design helps to minimize die area impact of adding filtering functions to the integrated circuit die 118. Typical values of the LPF 208 put the corner frequency at 12 KHz which corresponds to the typical acoustic resonance frequency for a miniature electret transducer such as the microphone 100. Since the LPF resistor 240 (including the output resistance of buffer 202) are in the signal path of the buffered output, the resistor 240 (as well as the output resistance of buffer 202) should be minimized in order to reduce the thermal noise contribution to the system noise. This makes for a larger value capacitor 242 on the order of several hundred Pico farads in order to keep the electronic noise low. Since the HPF 210 would benefit from a low value resistor 244 (around 5-10 MOhms) for good noise performance, a HPF corner frequency of 80 to 100 Hz requires that the HPF capacitor 246 needs to be several hundred pico farads as well.

In applications, such as in the miniature electret microphone 100, where sensitivity improvements are made by reducing signal loss through coupling capacitances to the back of the die by floating the substrate and minimizing the die area, the use of junction capacitance for the filters is advantageous. The nonlinear characteristics of these junction capacitors can be tolerated for most HI applications since the peak to peak signal amplitudes of the internal nodes in the buffer circuit 200 are small. Since the buffer circuit 200 is an impedance buffer, the junction capacitors may be biased with signals that are in phase with the input signal, which would further reduce the risk of forward biasing any of the junctions integrated into the filters 208 or 210. The variation of bias voltage with signal may shift the corner frequencies as well. This can also be tolerated in most HI applications, or can be compensated in other applications.

Junction capacitors utilized in a grounded substrate design for the microphone 100 would not give the same benefits for minimizing signal losses. This is because of the loading effect on the input of the buffer to the substrate (ground). The benefit of increasing the die area utilization by using junction diodes in a grounded substrate would not address the gain degradation that would occur due to capacitive loading in this situation.

Using linear capacitors in a floating substrate design would also not be as beneficial as using junction capacitors since the area of the capacitor would grow the area of the die and increase the stray capacitance that exits from the input to the substrate. This would not be optimal for reducing circuit noise because it does not minimize the feedback capacitor.

A more efficient and preferred use of die area in a floating substrate design would place the capacitors inside an isolation region, which is also used as a junction capacitor to increase the utilization of that area.

It should be noted that both the LPF 208 and the HPF 210 could also be comprised of a linear capacitor wired in parallel with the junction capacitor and be contained in the same isolation region as the junction capacitor in order to increase the capacitance per unit area of the structure.

Figure 3:
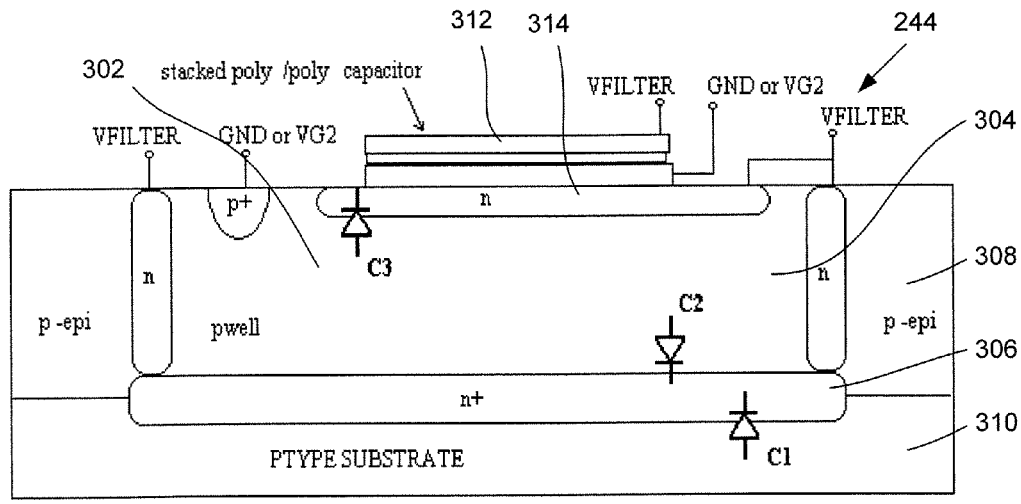
FIG. 3 is a schematic illustration of a silicon die incorporating one or more filters structures in accordance with the preferred embodiments of the invention.
Figure 4:
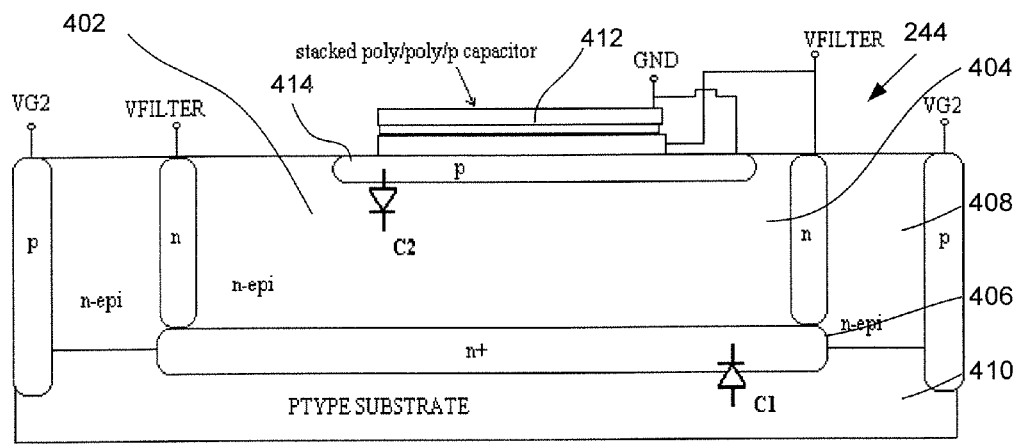
FIG. 4 is a schematic illustration of a silicon die incorporating one or more filters structures in accordance with the preferred embodiments of the invention.
Figure 5:
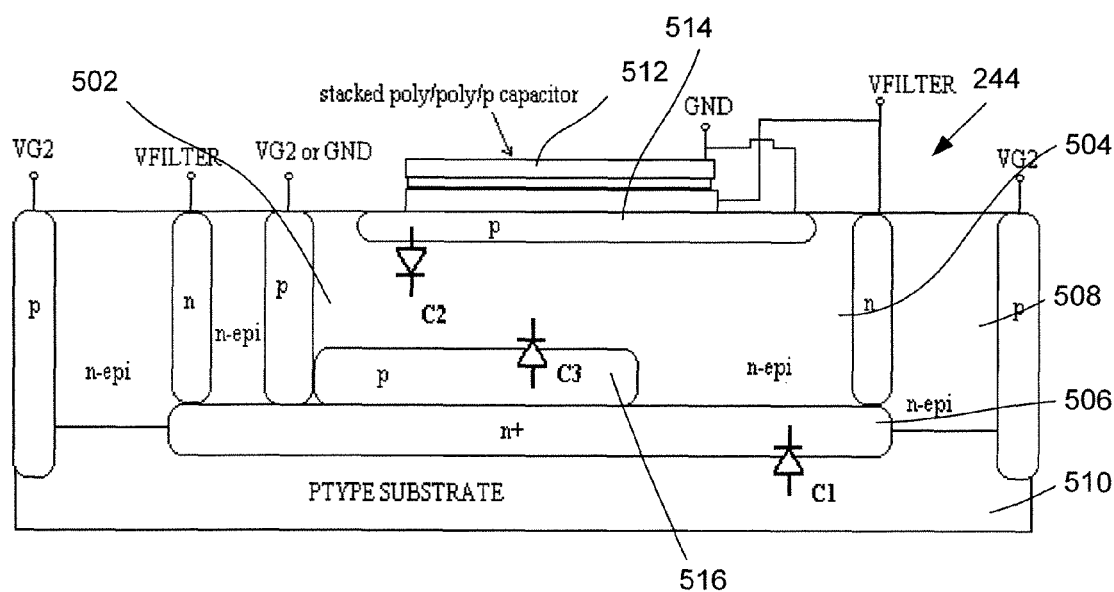
FIG. 5 is a schematic illustration of a silicon die incorporating one or more filters structures in accordance with the preferred embodiments of the invention.

FIG. 3 shows an illustration of the cross section of the LPF capacitor 242. The series combination of the first stage's output impedance and the resistor 240 drives the cathode of the LPF capacitor 242 which is an n-type isolation region 306 for the linear stacked capacitor 312 shown in FIG. 3. The linear capacitor 312 sits in a p-type well region 302 whose junction capacitance with the n-type isolation layer 306 can be used as part of the LPF 208 or HPF 210 capacitor depending on if it is biased to ground or to the input of the second stage. FIG. 3 shows a biCMOS process that has p-type epi layer 308 grown on a p-type substrate 310. Similar structures can be made for a n-type epi process as shown in FIG. 4, where like reference numerals beginning with 4_ identify like elements. FIGS. 3 and 4 show a stacked poly capacitor 312 and 412, respectively. For the structure of FIG. 4, the poly to diffusion capacitor is made with a p-type implant 414 instead of a n-type implant 314 as shown if FIG. 3. In this situation, more capacitance per unit area can be achieved by adding additional isolation junctions as shown in FIG. 5 where a p-type isolation layer 516 is added on top of the n-type buried layer 506.

It will be appreciated that numerous variations to the above-mentioned approaches are possible. Variations to the above approaches may, for example, include performing the above steps in a different order. Further, more than one linkage assembly may be mounted within a transducer. In another example, the linkage assembly may be formed as part of other components of the driving assembly. In yet another example, other components of the driving assembly may be formed in a similar manner.

All references, including publications, patent applications, and patents, cited herein are hereby incorporated by reference to the same extend as if each reference were individually and specifically indicated to the incorporated by reference and were set forth in its entirety herein.

Preferred embodiments of this invention are described herein, including the best mode known to the inventor for carrying out the invention. It should be understood that the illustrated embodiments are exemplary only, and should not be taken as limiting the scope of the invention.

I claim:

1. A buffer circuit for a transducer comprising:
    an integrated circuit including a floating substrate and a p-n junction;
    a filter circuit formed within the integrated circuit, the filter circuit including a capacitor formed by the p-n junction; and
    a first buffer stage coupled to an output of the transducer and a second buffer stage providing a buffer circuit output, the filter circuit disposed between the first buffer stage and the second buffer stage.

2. The buffer circuit of claim 1, wherein the p-n junction is formed within an isolation region of the integrated circuit.

3. The buffer circuit of claim 1, comprising a linear capacitor coupled to the p-n junction.

4. The buffer circuit of claim 1, the capacitor being non-linear.

5. The buffer circuit of claim 1, the p-n junction being biased in phase with an output signal of the transducer.

6. A buffer circuit for a transducer comprising:
    an integrated circuit including a floating substrate and a p-n junction;
    a filter circuit formed within the integrated circuit, the filter circuit including a capacitor formed by the p-n junction; and
    a first filter and a second filter, the p-n junction comprising a first p-n junction and a second p-n junction, wherein the first p-n junction forms a first capacitor of the first filter and the second p-n junction forms a second capacitor of the second filter.

* * * * *